(12) United States Patent
Kawata et al.

(10) Patent No.: US 11,557,739 B2
(45) Date of Patent: Jan. 17, 2023

(54) FLEXIBLE SUBSTRATE

(71) Applicant: Japan Display Inc., Tokyo (JP)

(72) Inventors: Yasushi Kawata, Tokyo (JP); Takumi Sano, Tokyo (JP)

(73) Assignee: Japan Display Inc., Tokyo (JP)

( * ) Notice: Subject to any disclaimer, the term of this patent is extended or adjusted under 35 U.S.C. 154(b) by 179 days.

(21) Appl. No.: 17/032,228

(22) Filed: Sep. 25, 2020

(65) Prior Publication Data

US 2021/0013431 A1 Jan. 14, 2021

Related U.S. Application Data

(63) Continuation of application No. PCT/JP2019/002357, filed on Jan. 24, 2019.

(30) Foreign Application Priority Data

Mar. 27, 2018 (JP) .............................. JP2018-060196

(51) Int. Cl.
*H01L 51/00* (2006.01)
*H01L 27/32* (2006.01)

(52) U.S. Cl.
CPC ...... *H01L 51/0097* (2013.01); *H01L 27/3276* (2013.01)

(58) Field of Classification Search
CPC ............. H01L 51/0097; H01L 27/3276; Y02E 10/549; G09F 9/00; H05K 1/02
See application file for complete search history.

(56) References Cited

U.S. PATENT DOCUMENTS

| 2010/0330338 | A1 | 12/2010 | Boyce et al. |
| 2015/0282294 | A1 | 10/2015 | Wakuda et al. |
| 2015/0282296 | A1 | 10/2015 | Ogura et al. |
| 2017/0057704 | A1 | 3/2017 | Li et al. |
| 2017/0181276 | A1 | 6/2017 | Sawada et al. |
| 2021/0289621 | A1* | 9/2021 | Sano .................... H05K 1/0283 |

FOREIGN PATENT DOCUMENTS

| JP | 2008-89633 A | 4/2008 |
| JP | 2015-198101 A | 11/2015 |
| JP | 2015-198102 A | 11/2015 |
| JP | 2017-118109 A | 6/2017 |

OTHER PUBLICATIONS

English machine translation of Notice of Reasons for Refusal dated Feb. 1, 2022 in Japanese Patent Application No. 2018-060196, 4 pages.
International Search Report dated Apr. 9, 2019 in PCT/JP2019/002357 filed Jan. 24, 2019, 1 page.

* cited by examiner

*Primary Examiner* — Kyoung Lee
(74) *Attorney, Agent, or Firm* — Maier & Maier, PLLC

(57) ABSTRACT

According to an embodiment, a flexible substrate includes a flexible insulating base and a plurality of wirings on the insulating base. Furthermore, the insulating base includes a first opening, a second opening shape of which is different from that of the first opening, and a first line portion. The first line portion is disposed between the first opening and the second opening.

20 Claims, 11 Drawing Sheets

FLEXIBLE SUBSTRATE

CROSS-REFERENCE TO RELATED APPLICATIONS

This application is a Continuation Application of PCT Application No. PCT/JP2019/002357, filed Jan. 24, 2019 and based upon and claiming the benefit of priority from Japanese Patent Application No. 2018-060196, filed Mar. 27, 2018, the entire contents of all of which are incorporated herein by reference.

FIELD

Embodiments described herein relate generally to a flexible substrate.

BACKGROUND

In recent years, utilization of flexible substrates with flexibility and expansion/contraction characteristics is considered in various technical fields. For example, a flexible substrate in which electrical elements are arranged in a matrix may be adhered to a casing of an electronic device or a human body. An electrical element may be, for example, various sensors such as a touch sensor and a temperature sensor, or a display element.

A flexible substrate must be prepared to prevent a damage to wirings therein by a force caused by bending or expansion/contraction. In order to prepare such a case, for example, a honeycomb-shaped openings are provided with the base substrate supporting the wirings, or meandering wirings are proposed.

The flexible substrate is further required to have narrower-pitched wirings and high density electrical elements, in addition to the flexibility and the expansion/contraction characteristics.

DETAILED DESCRIPTION

In general, according to an embodiment, a flexible substrate includes a flexible insulating base and a plurality of wirings on the insulating base. Furthermore, the insulating base includes a first opening, a second opening shape of which is different from that of the first opening, and a first line portion. The first line portion is disposed between the first opening and the second opening.

According to such a structure, a flexible substrate with narrower-pitched wirings and high density electrical elements can be obtained.

Embodiments will be described hereinafter with reference to the accompanying drawings.

Note that the disclosure is merely an example, and any embodiment which is conceivable by a person having an ordinary skill in the art within the spirit of the invention is encompassed by a range of the present invention. Furthermore, for better understanding of the explanation, figures may be drawn more schematically as compared to an actual embodiment, and they are merely for clarification. Such schematic illustration does not limit the interpretation of the present invention. In each figure, some of same or similar elements arranged continuously may not be denoted, and the reference numbers may be omitted. Furthermore, in the description and each figure, structural elements which are functionally the same or similar to those have been explained already will be referred to by the same reference numbers and the explanation considered to be redundant will be omitted.

First Embodiment

Figure 1:
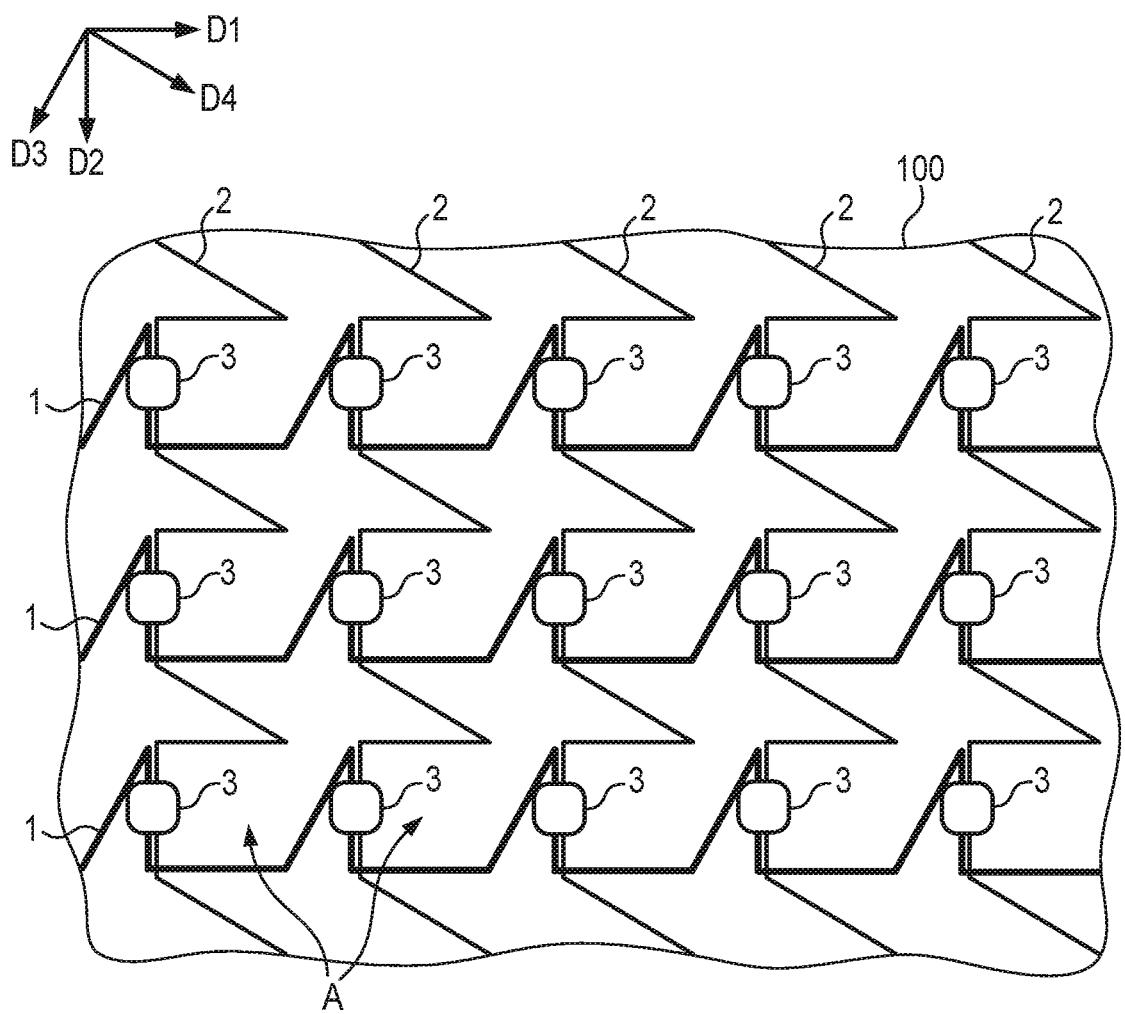
FIG. 1 is a schematic plan view of a flexible substrate 100 of a first embodiment.

FIG. 1 is a schematic plan view of a flexible substrate 100 of the first embodiment. In the present embodiment, as in the figure, a first direction D1, a second direction D2, a third direction D3, and a fourth direction D4 will be defined. Each of the directions D1 to D4 is parallel to the main surface of the flexible substrate 100, and crosses each other. The first direction D1 and the second direction D2 are orthogonal to each other in the present embodiment; however, they may cross each other at a different angle. Furthermore, the third direction D3 and the fourth direction D4 are orthogonal to each other in the present embodiment; however, they may cross each other at a different angle.

The flexible substrate 100 includes a plurality of scan lines 1, a plurality of signal lines 2, and a plurality of electrical elements 3. The scan line 1 and the signal line 2 are an example of the wirings of the flexible substrate 100. The scan line 1 and the signal line 2 may be formed of a metal material or a transparent conductive material, and may have a mono-layer structure or a multi-layer structure, for example. The flexible substrate 100 may include, in addition to the scan line 1 and the signal line 2, various wirings such as a power line to supply power to the electrical element 3.

The scan lines 1 generally extend in the first direction D1 and are aligned in the second direction D2. The signal lines 2 generally extend in the second direction D2 and are aligned in the first direction D1. Specifically, the scan line 1 has a wave-like shape in which a straight line portion parallel to the first direction D1, straight line portion parallel to the third direction D3, and straight line portion parallel to the second direction D2 are repeated orderly. Similarly, the signal line 2 has a wave-like shape in which a straight line portion parallel to the second direction D2, straight line portion parallel to the fourth direction D4, and straight line portion parallel to the first direction D1 are repeated orderly.

A polygonal area A is formed by two adjacent scan lines 1 and two adjacent signal lines 2. In the example of FIG. 1, the area A of same shape is repeated in the first direction D1 and the second direction D2.

The electrical element 3 is electrically connected to the scan line 1 and the signal line 2. In the example depicted, the electrical element 3 is arranged in a part where the scan line 1 and the signal line 2 are parallel to the second direction D2. Note that the arrangement position of the electrical element 3 is not limited to the above example.

For example, the electrical element 3 is a sensor, semiconductor device, or actuator. For example, the sensor may be a temperature sensor, pressure sensor, or touch sensor. For example, the semiconductor device may be a light-emitting device, light-receiving device, diode, or transistor. If the electrical element 3 is a light-emitting device, a flexible display with flexibility and expansion/contraction characteristics can be achieved. The light-emitting device may be, for example, a light-emitting diode or an organic electroluminescent device. Note that the electrical element 3 is not limited to the aforementioned examples, and may be a device with various functions. The electrical element 3 may be a condenser or a resistor.

The scan line 1 supplies a scan signal to the electrical element 3. For example, if the electrical element 3 is a sensor which outputs a signal, an output signal from the electrical element 3 is supplied to the signal line 2. Furthermore, if the electrical element 3 is a light-emitting device of an actuator which functions in response to a signal input thereto, a drive signal is supplied to the signal line 2. A controller including, for example, a supply source of the scan signal, supply source of the drive signal, or processor to process the output signal may be provided with the flexible substrate 100 or with a device connected to the flexible substrate 100.

Figure 2:
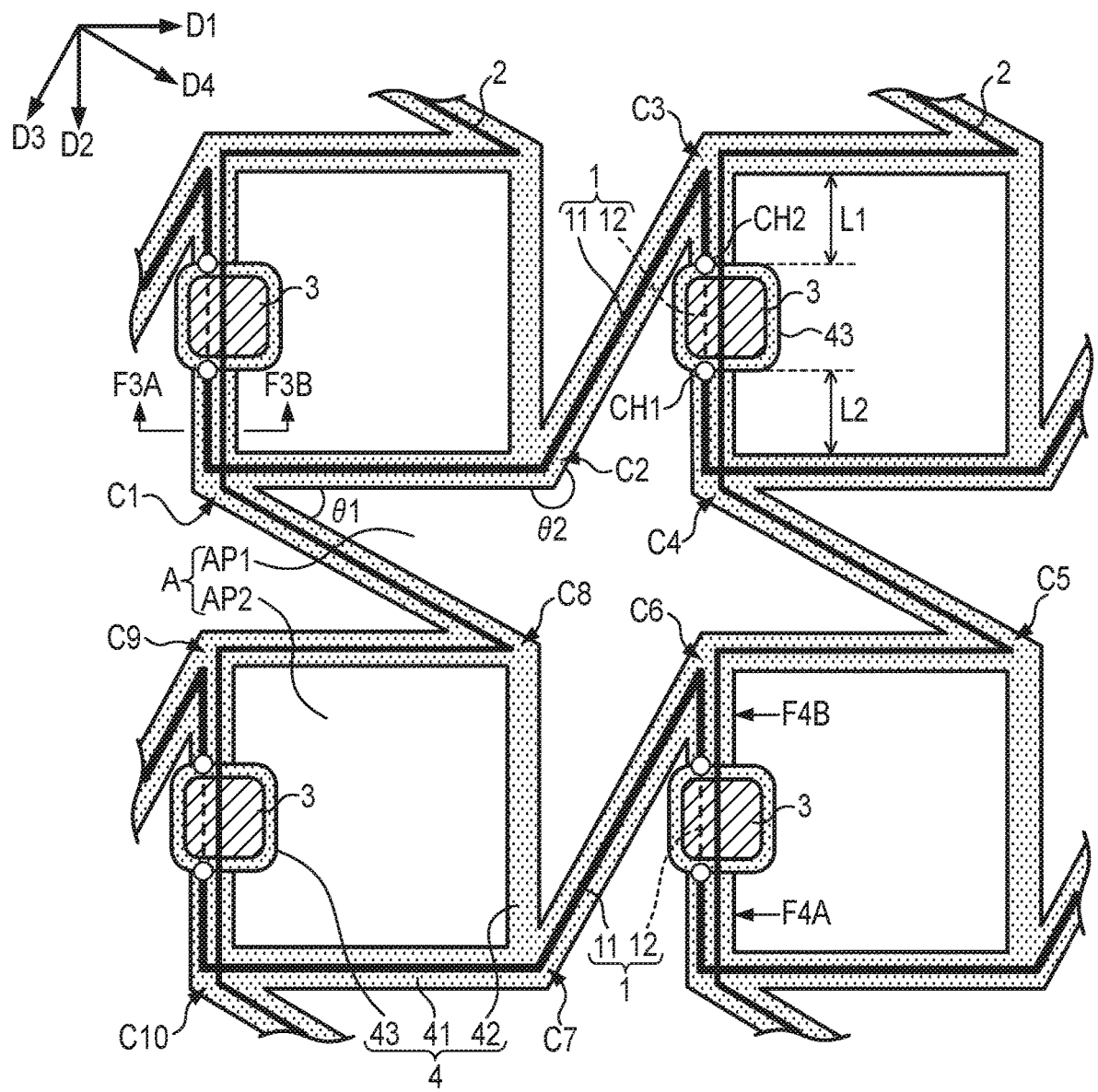
FIG. 2 is a schematic plan view of the flexible substrate 100, illustrated in a partially-enlarged manner.

FIG. 2 is a schematic plan view of the flexible substrate 100, illustrated in a partially-enlarged manner. In the proximity of the electrical element 3, the scan line 1 and the signal line 2 are close together to be extending in parallel; however, in the actuality, the scan line 1 and the signal line 2 are layered in the thickness direction of the flexible substrate 100 as will be described later with reference to FIG. 3.

The flexible substrate 100 includes a flexible insulating base 4 supporting the scan line 1 and the signal line 2. The insulating base 4 is formed of, for example, polyimide; however, the material is not limited thereto.

The insulating base 4 includes a plurality of line portions 41, a plurality of line portions 42 (dummy line portions), and a plurality of island parts 43. The line portion 41 overlaps with at least one of the scan line 1 and the signal line 2. The line portion 42 does not overlap the scan line 1 or the signal line 2. The line portions 41 and 42 are shaped linearly. The island part 43 overlaps with the electrical element 3 and is connected to the line portion 41. The line portion 42 is an example of a first line portion and the line portion 41 is an example of a second line portion.

With the line portions 41 and 42, a polygonal-shaped first opening AP1 and a polygonal-shaped second opening AP2 which is different from the first opening AP1 are defined. In the example of FIG. 2, the first opening AP1 is shaped as a star-like pentagon with eight corners C1 to C8. The second opening AP2 is shaped as a rectangle with four corners C7 to C10. The corners C1 to C10 are the points where two or more line portions 41, or line portions 41 and 42 are connected at different angles. The shapes of the first and second openings AP1 and AP2 are not limited to the aforementioned examples, and various shapes can be applied thereto.

In the example of FIG. 2, the number of the line portions 41 and 42 (first group of line portions) to be connected to the line portion 42 between the first opening AP1 and the second opening AP2 to define the first opening AP1 is different from the number of the line portions 41 and 42 (second group of line portions) to be connected to the line portion 42 between the first opening AP1 and the second opening AP2 to define the second opening AP2. However, the number of the line portions 41 and 42 defining the first opening AP1 and the number of the line portions 41 and 42 defining the second opening AP2 may be the same.

The line portion 41 between the corners C1 and C2 and the line portion 41 between the corners C7 and C10 overlap with the scan line 1, and are parallel to the first direction D1. The line portion 41 between the corners C5 and C6 and the line portion 41 between the corners C8 and C9 overlap with the signal line 2, and are parallel to the first direction D1.

The line portion 41 between the corners C3 and C4, and the line portion 41 between the corners C9 and 010 overlap with the scan line 1 and the signal line 2, and are parallel to the second direction D2. The line portion 42 between the corners C7 and C8 does not overlap with the scan line 1 or the signal line 2, and is parallel to the second direction D2.

The line portion 41 between the corners C2 and C3, and the line portion 41 between the corners C6 and C7 overlap with the scan line 1, and are parallel to the third direction D3. The line portion 41 between the corners C1 and C8, and the line portion 41 between the corners C4 and C5 overlap with the signal line 2, and are parallel to the fourth direction D4.

As described above, the first opening AP1 and the second opening AP2 are defined by the line portions 41 and 42 extending in four different directions. The first opening AP1 and the second opening AP2 are included in one area A. The first opening AP1 and the second opening AP2 correspond to two areas of the area A divided by the line portion 42. From a different point of view, the line portion 42 is arranged in the boundary of the first opening AP1 and the second opening AP2. Three or more openings may be formed in the area A by providing two or more line portions 42 with the area A.

The interior angle θ1 of the first opening AP1 at corners C1, C3, C5, and C7 is less than the interior angle θ2 of the first opening AP1 at corners C2, C4, C6, and C8 (θ1<θ2). In the example of FIG. 2, the interior angle θ1 is an acute angle (θ1<90°), and the interior angle θ2 is an angle above 180° (θ2>180°).

The shape of the first opening AP1 is a four-fold symmetry which becomes the same shape after a 90° rotation. Note that the first opening AP1 may be five-fold symmetry or a six-fold symmetry other than the four-fold symmetry. Furthermore, the first opening AP1 may be three or less-fold symmetry.

The island part 43 is disposed in the proximity of the center of the line portion 41 overlapping with the scan line 1 and the signal line 2. The electrical element 3 is disposed above the island part 43. The island part 43 is greater than the electrical element 3, and in FIG. 2, the island part 43 protrudes out of the edge of the electrical element 3. For example, focusing on the line portion 41 between the corners C3 and C4, a length L1 from the upper end of the line portion 41 to the island part 43 is equal to a length L2 from the lower end of the line portion 41 to the island part 43. Note that the lengths L1 and L2 may be different.

The scan line 1 includes a first part 11 depicted in a solid line and a second part 12 depicted in a broken line. The second part 12 overlaps with the electrical element 3. The first par 11 and the second part 12 are disposed in different layers, and are electrically connected through contact holes CH1 and CH2.

Figure 3:
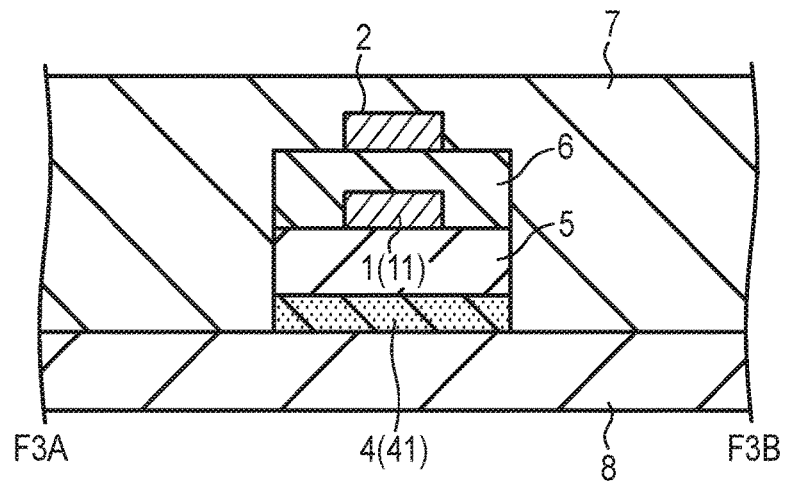
FIG. 3 is a partial schematic cross-sectional view of the flexible substrate 100, taken along F3A-F3B of FIG. 2.

FIG. 3 is a partial schematic cross-sectional view of the flexible substrate 100 taken along F3A-F3B of FIG. 2. The flexible substrate 100 further includes a first organic insulating layer 5, second organic insulating layer 6, coating layer 7, and support film 8, in addition to the aforementioned elements. The first organic insulating layer 5 and the second organic insulating layer 6 are formed of an organic material. The coating layer 7 is formed of, for example, parylene (polyparaxylylene).

The first organic insulating layer 5 covers the upper surface of the insulating base 4. The scan line 1 (first part 11) is disposed above the first organic insulating layer 5. The second organic insulating layer 6 covers the scan line 1 and the first organic insulating layer 5. The signal line 2 is disposed above the second organic insulating layer 6. The coating layer 7 covers the signal line 2, insulating base 4, first organic insulating layer 5, and second organic insulating layer 6.

The support film 8 covers the lower surface of the insulating base 4. In the area where there is no insulating base 4, the coating layer 7 and the support film 8 contact each other. That is, the support film 8 overlaps with the line portions 41 and 42, and the first and second openings AP1 and AP2 in a plan view. The support film 8 may be formed by applying a resin material to the lower surface of the insulating base 4 and the coating layer 7, or may be adhered thereto via an adhesive layer.

Note that the first organic insulating layer 5 and the second organic insulating layer 6 may be provided with the area where there is no insulating base 4 (where there are the first opening AP1 and the second opening AP2). However, from a viewpoint of the flexibility and the expansion/contraction characteristics of the flexible substrate 100, the arrangement as in FIG. 3 is preferable.

Figure 4:
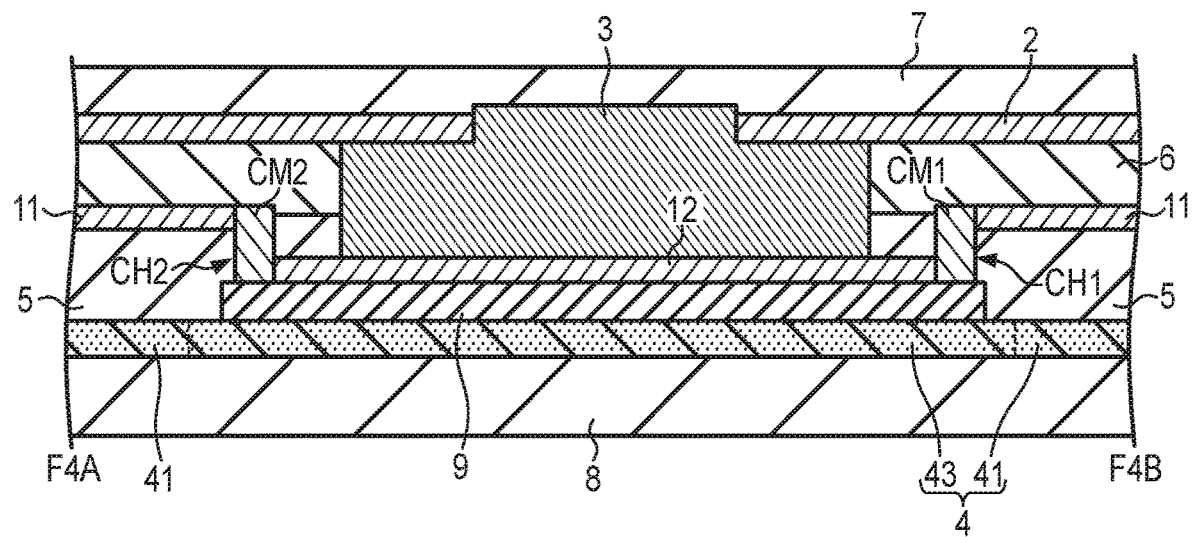
FIG. 4 is a partial schematic cross-sectional view of the flexible substrate 100, taken along F4A-F4B of FIG. 2.
Figure 5:
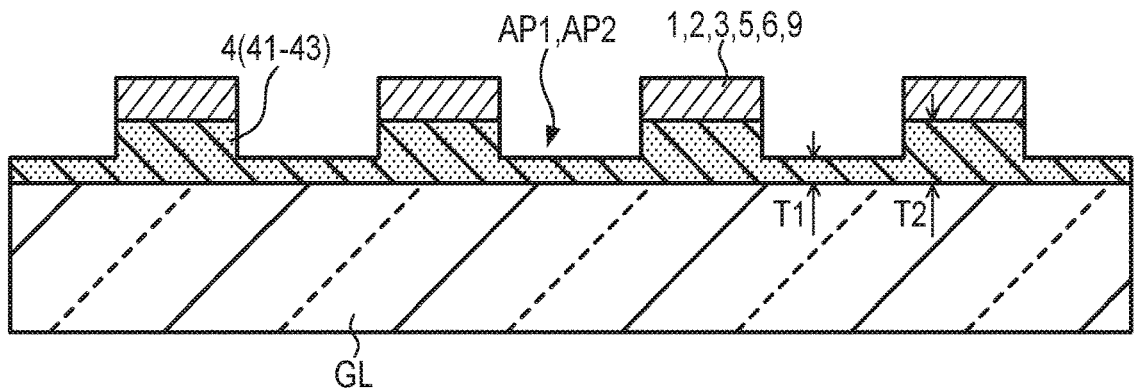
FIG. 5 is a schematic cross-sectional view illustrating a manufacturing method of the flexible substrate 100.

FIG. 4 is a partial schematic cross-sectional view of the flexible substrate 100, taken along F4A-F4B of FIG. 2. An inorganic insulating layer 9 (passivation layer) is formed between the electrical element 3 and the island part 43. The inorganic insulating layer 9 is in an island shape overlapping the electrical element 3 in a plan view. The first part 11 of the scan line 1 is disposed above the first organic insulating layer 5. The second part 12 of the scan line 1 is disposed above the inorganic insulating layer (that is, below the first organic insulating layer 5). The second part 12 is electrically connected to the electrical element 3. In the example of FIG. 4, the end of the second part 12 is covered with the first organic insulating layer 5.

The aforementioned contact holes CH1 and CH2 are provided with the first organic insulating layer 5 in the area overlapping with the island part 43 and the inorganic insulating layer 9 in a plan view. The first part 11 of the scan line 1 is electrically connected via connection members CM1 and CM2 provided with the contact holes CH1 and CH2, respectively. The connection members CM1 and CM2 may be a part of the first part 11, or may be separated from the first part 11.

FIGS. 5 to 9 are schematic cross-sectional views orderly illustrating an example of a manufacturing method of the flexible substrate 100. Initially, in FIG. 5, the insulating base 4 is formed on a glass substrate GL. The insulating base 4 includes protrusion parts corresponding to the line portion 41, line portion 42, and island part 43. In this step, the insulating base 4 is formed in the area corresponding to the first opening AP1 and the second opening AP2. Above the line portion 41, line portion 42, and island part 43, the scan line 1, signal line 2, electrical element 3, first organic insulating layer 5, second organic insulating layer 6, and inorganic insulating layer 9 are formed. For example, a thickness T1 of the insulating base 4 in the area corresponding to the first opening AP1 and the second opening AP2 is between 1 and 2 μm (1 μm≤T1≤2 μm). A thickness T2 of the insulating base 4 in the area corresponding to the line portion 41, line portion 42, and island part 43 is between T1 and 20 μm (T1≤T2≤20 μm).

Figure 6:
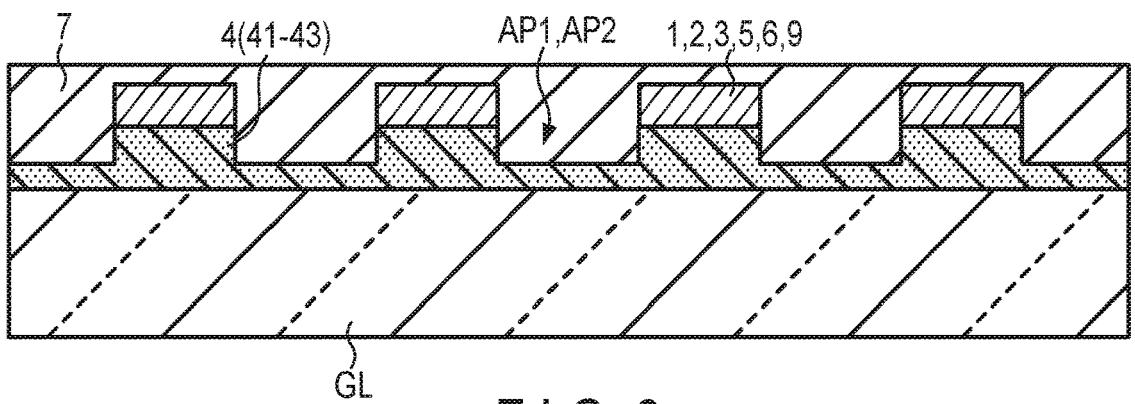
FIG. 6 is a schematic cross-sectional view illustrating the manufacturing method after FIG. 5.

The coating layer 7 is formed in FIG. 6. The coating layer 7 fills the area corresponding to the first opening AP1 and the second opening AP2, and is continuous in the entirety of the flexible substrate 100 over the line portion 41, line portion 42, and island part 43.

Figure 7:
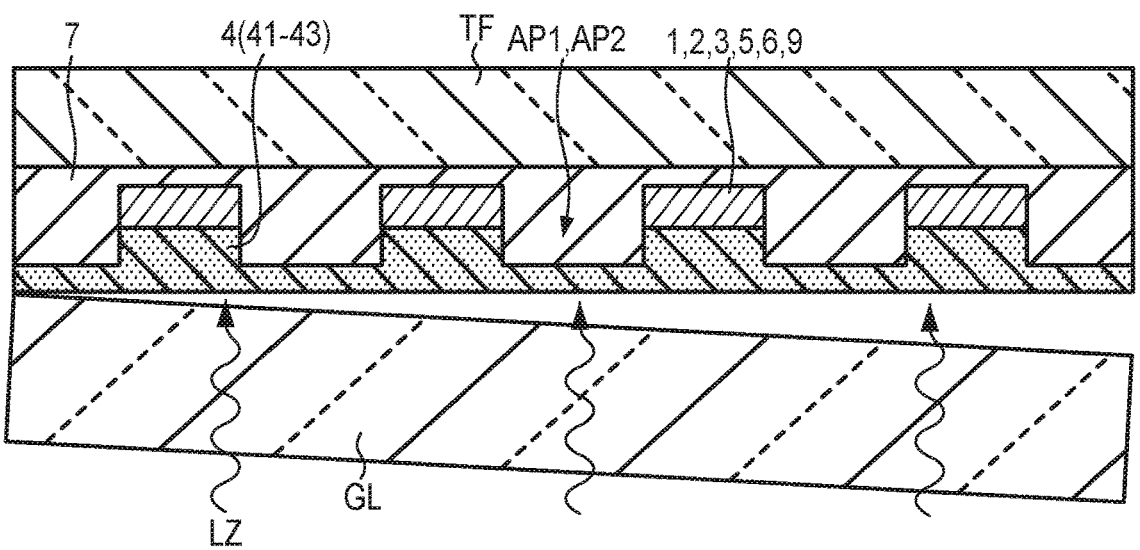
FIG. 7 is a schematic cross-sectional view illustrating the manufacturing method after FIG. 6.

In FIG. 7, a temporal support film TF is adhere to the upper surface of the coating layer 7. The temporal support film TF may be, for example, a polyethylene terephthalate (PET) film. While the temporal support film TF is adhered thereto, laser light LZ is irradiated from the lower direction of the glass substrate GL, to exfoliate the insulating base 4 from the glass substrate GL.

Figure 8:
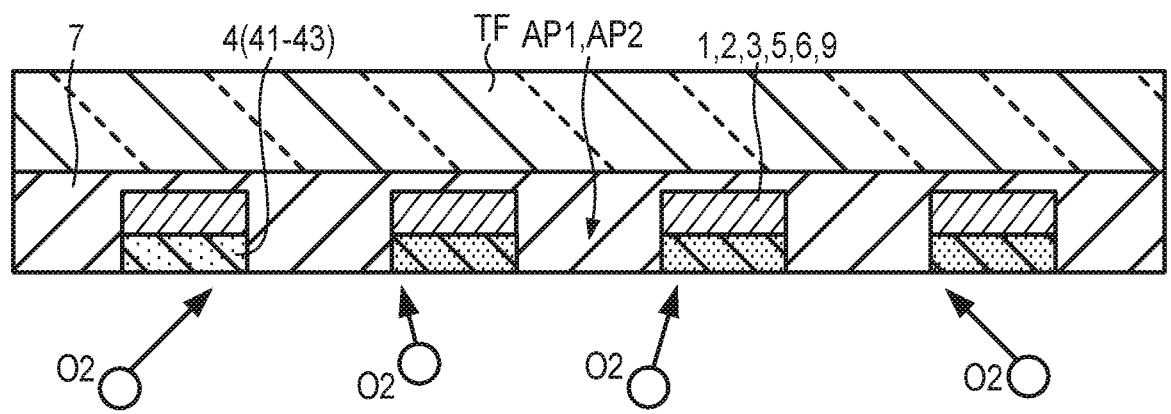
FIG. 8 is a schematic cross-sectional view illustrating the manufacturing method after FIG. 7.

In FIG. 8, the lower surface of the insulating base 4 is subjected to dry asking using an oxygen gas. Thus, the insulating base 4 in the area corresponding to the first opening AP1 and the second opening AP2 is removed.

Figure 9:
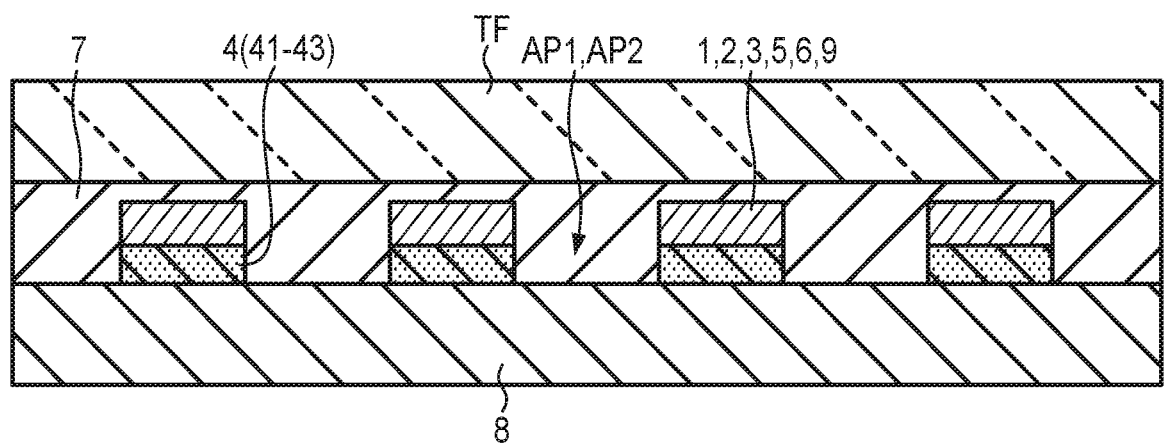
FIG. 9 is a schematic cross-sectional view illustrating the manufacturing method after FIG. 8.

In FIG. 9, the support film 8 is formed in the lower surface of the insulating base 4 and the coating layer 7. The support film 8 may be formed by applying a resin material to the lower surface of the insulating base 4 and the coating layer 7, or the support film 8 which is preliminarily prepared may be adhered thereto via an adhesive layer. Then, the temporal support film TF is exfoliated to achieve the flexible substrate 100 with the cross-sectional shapes shown in FIGS. 3 and 4.

As explained above, in the flexible substrate 100 of the present embodiment, the insulating base 4 includes the first opening AP1 and the second opening AP2. With the first opening AP1 and the second opening AP2 of different shapes, the flexible substrate 100 can exert the flexibility and the expansion/contraction characteristics in various directions. Furthermore, the line portions 41 and 42 of the first and second openings AP1 and AP2 are linear as a basic structure of general array designs. Thus, as compared to a case where curved patterns such as a meandering shape are used, the narrow pitch between the scan line 1 and the signal line 2 and the high density of the electrical element 3 can be easily achieved.

The line portion 42 does not overlap the scan line 1 or the signal line 2. Thus, with the line portion 42 which does not support the line, the first opening AP1 and the second opening AP2 can be shaped properly without depending on the shapes of the scan line 1 and the signal line 2.

The first opening AP1 and the second opening AP2 are included in an area A defined by two adjacent scan lines 1 and two adjacent signal lines 2. Since areas A are arranged in a matrix over the entirety of the flexible substrate 100, the first and second openings AP1 and AP2 are dispersed in the entirety of the flexible substrate 100. Thus, the flexibility and the expansion/contraction characteristics can be applied to the wide range over the flexible substrate 100.

Furthermore, in the example of FIG. 2, the first opening AP1 has a four-fold symmetry shape. Thus, as compared to a case where the first opening AP1 has a two-fold symmetry shape, for example, the direction dependency of the flexibility and the expansion/contraction characteristics of the flexible substrate 100 can be reduced.

Furthermore, in the example of FIG. 2, the first opening AP1 includes an interior angle θ2 of 180° or more. With a shape including such a large interior angle, the area of the first opening AP1 can be decrease das compared to a case where the first opening AP1 is formed with an interior angle of less than 180°. Thus, the scan line 1, signal line 2, and electrical element 3 can be formed with a high density.

As in FIG. 4, island-shaped inorganic insulating layer 9 is arranged between the electrical element 3 and the insulating base 4. With the inorganic insulating layer 9, the electrical element 3 and the second part 12 of the scan line 1 are protected, and the reliability of the flexible substrate 100 can be increased. On the other hand, since an inorganic film have cracks as compared to an organic film, there may be a disconnection of wirings caused by cracks if they are formed on an inorganic film. Note that, as in FIG. 4, the inorganic insulating layer 9 is not disposed below the first part 11 of the scan line 1 or the signal line 2. Thus, a line disconnection does not easily occur in the scan line 1 and the signal line 2. Furthermore, if the inorganic insulating layer 9 is hypothetically provided with the entirety of the flexible substrate 100, it may reduce the flexibility and the expansion/contraction characteristics of the flexible substrate 100; however, the island-shaped inorganic insulating layer 9 does not cause such a problem.

Furthermore, with the structure in which the first part 11 and the second part 12 of the scan line 1 disposed in the different layers are connected through the contact holes CH1 and CH2, the freedom of design in the proximity of the electrical element 3 is increased. Since the contact holes CH1 and CH2 are disposed in the upper direction of the inorganic insulating layer 9, the reliability of the connection position of the first part 11 and the second part 12 is increased accordingly.

Below the electrical element 3, the island part 43 of the insulating base 4 is disposed. Thus, the electrical element 3 can be suitably supported. Furthermore, the insulating base 4 is supported by the support film 8 which overlaps not only the line portions 41 and 42 and the island part 43 but also the first and second openings AP1 and AP2. With the support film 8, the strength of the whole flexible substrate 100, and a water entry from the lower direction can be prevented which can increase the reliability of the flexible substrate 100.

The electrical element 3 is, as in FIG. 2, disposed in the line portion 41, and is apart from the connection point of the line portions 41. Thus, even if the flexible substrate 100 is expanded/contracted or bent, the force does not easily transfer to the proximity of the electrical element 3. Thus, the reliability of the electrical element 3 increases. As described above, with the lengths L1 and L2 which are distances from both ends of the line portion 41 to the island part 43 are equal, the force applied to the electrical element 3 can be more suitably decreased.

In addition to the aforementioned examples, various suitable advantages can be achieved from the present embodiment.

Second Embodiment

The second embodiment will be described now. Structures and advantages which are not mentioned in this embodiment are the same as in the first embodiment.

Figure 10:
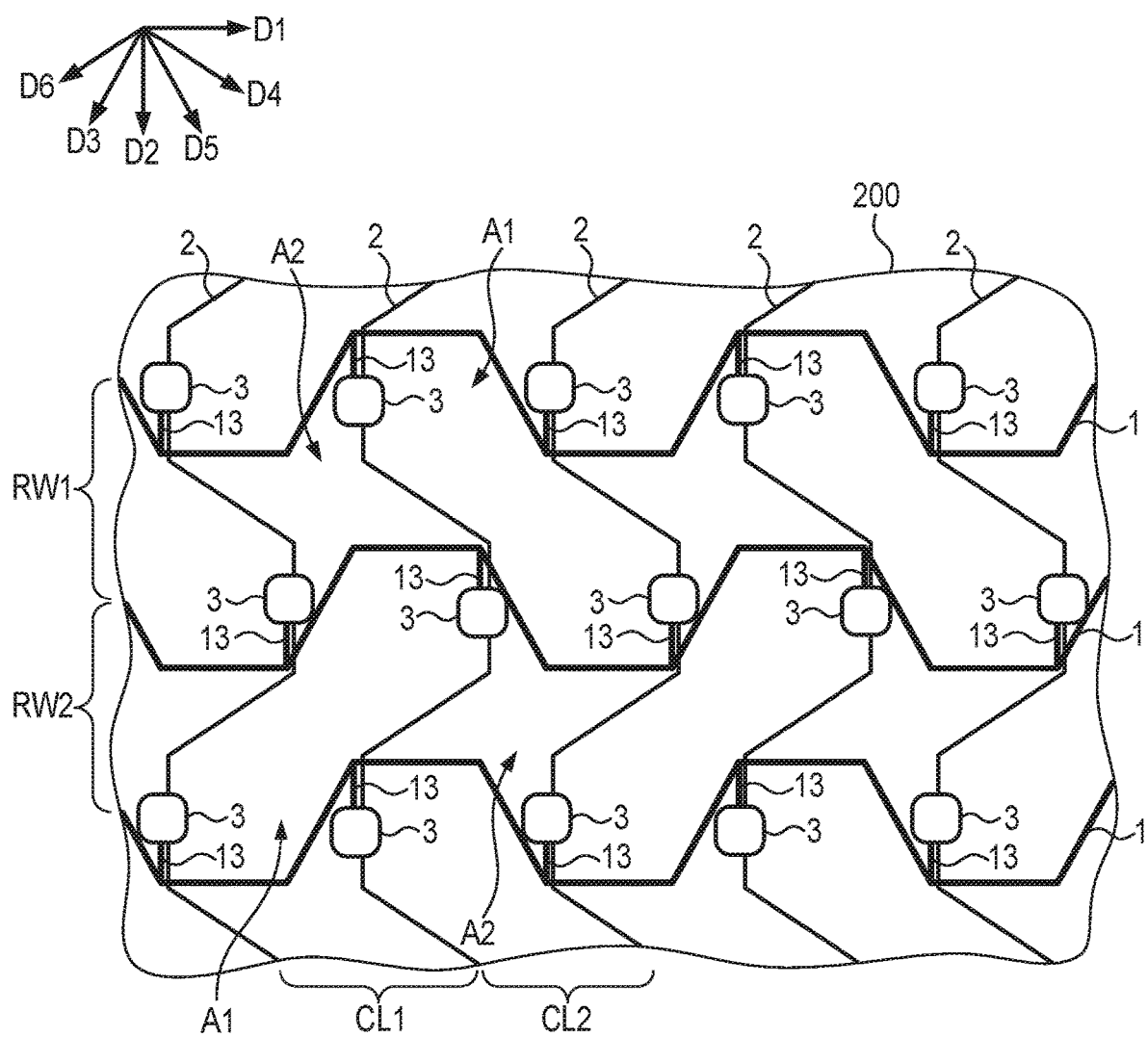
FIG. 10 is a schematic plan view of a flexible substrate 200 of a second embodiment.

FIG. 10 is a schematic plan view of a flexible substrate 200 of the present embodiment. In the present embodiment, in addition to the first to fourth directions D1 to D4, a fifth direction D5 and a sixth direction D6 will be defined as in the figure. The directions D1 to D6 are parallel to the main surface of the flexible substrate 200, and cross each other.

The scan line 1 has a wave-like shape in which a straight line portion parallel to the first direction D1, straight line portion parallel to the third direction D3, straight line portion parallel to the first direction D1, and straight line portion parallel to the fifth direction D5 are repeated orderly. The signal line 2 has a wave-like shape in which a straight line portion parallel to the second direction D2, straight line portion parallel to the fourth direction D4, straight line portion parallel to the second direction D2, and straight line portion parallel to the sixth direction D6 are repeated orderly.

Polygonal first area A1 and second area A2 are defined by two adjacent scan lines 1 and two adjacent signal lines 2. The first area A1 and the second area A2 are repeated alternatively in the first direction D1 in a row between two adjacent scan lines 1. Furthermore, in rows RW1 and RW2 in the figure, the shapes of the first area A1 and the second area A2 are bilaterally symmetry with respect to the axis parallel to the first direction D1.

From a different point of view, the first area A1 and the second area A2 are repeated alternatively in the second direction D2 in the row between two adjacent signal lines 2. Furthermore, in columns CL1 and CL2 in the figure, the shapes of the first area A1 and the second area A2 are bilaterally symmetry with respect to the axis parallel to the second direction D2.

The scan line 1 includes an extension portion 13. The extension portion 13 extends from the position where the scan line 1 is bent to the electrical element 3. Except for the extension portion 13, the scan line 1 and the signal line 2 are not parallel. Thus, capacitance coupling of the scan line 1 and the signal line 2 can be suppressed. Furthermore, except for the extension portion 13, the scan line 1 and the signal line 2 are bent at an obtuse angle. Thus, force concentration to the bending part can be suppressed as compared to a case where the lines are bent at an acute angle.

Figure 11:
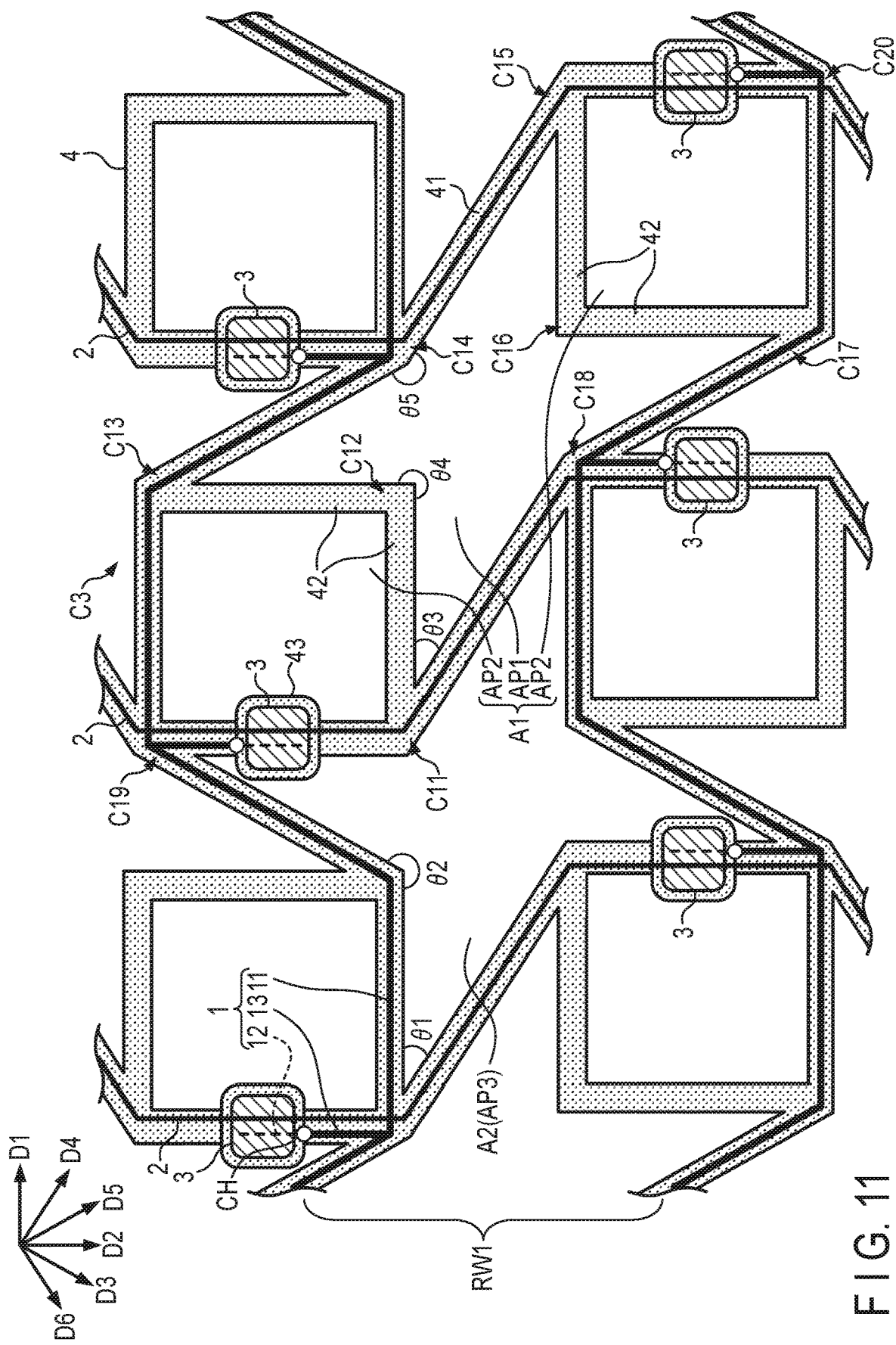
FIG. 11 is a schematic plan view of the flexible substrate 200, illustrated in an enlarged manner.

FIG. 11 is a schematic plan view of the row RW1 of the flexible substrate 200 in an enlarged manner. In the proximity of the electrical element 3, the extension portion 13 of the scan line 1 and the signal line 2 extend closely and in parallel to each other; however, in the actuality, the extension portion 13 and the signal line 2 are layered in the thickness direction of the flexible substrate 200.

The scan line 1 and the signal line 2 overlap with the line portion 41. A plurality of line portions 42 are arranged in the first area A1. On the other hand, the line portion 42 is not arranged in the second area A2. In the first area A1, with the line portions 41 and 42, a polygonal first opening AP1 and two polygonal second openings AP2 are defined. In the second area A2, a polygonal third opening AP3 is defined with the line portions 41.

The first opening AP1 is an octagon with eight corners C11 to C18. The second opening AP2 is a rectangle as with the second opening AP2 of FIG. 2. The third opening AP3 is a star-shaped octagon as with the first opening AP1 of FIG. 2.

The line portion 42 between the corners C11 and C12 and the line portion 42 between the corners C15 and C16 are parallel to the first direction D1. The line portion 42 between the corners C12 and C13 and the line portion 42 between the corners C16 and C17 are parallel to the second direction D2. The line portion 41 between the corners C13 and C14 and the line portion 41 between the corners C17 and C18 overlap with the scan line 1, and are parallel to the fifth direction D5. The line portion 41 between the corners C14 and C15 and the line portion 41 between the corners C11 and C18 overlap with the signal line 2, and are parallel to the fourth direction D4.

In the row RW2 shown in FIG. 10, the first area A1 includes a first opening AP1 and two second openings AP2, and the second area A2 includes a third opening AP3. The shapes of the openings AP1 to AP3 in the row RW2 are bilaterally symmetry to the openings AP1 to AP3 of the row RW1 with respect to the axis parallel to the first direction D1. Thus, the first opening AP1 of the row RW2 includes the line portion 41 parallel to the third direction D3 and the line portion 41 parallel to the sixth direction D6. As can be understood from the above, the pattern of the insulating base 4 is structured with the line portions 41 and 42 extending in six different directions.

The interior angle $\theta 3$ of the first opening AP1 at corners C11, C13, C15, and C17 is an acute angle ($\theta 3 < 90°$). The interior angle $\theta 4$ of the first opening AP1 at corners C12 and C16 is 180° or more ($\theta 4 > 180°$), and in this example, 270°. The interior angle $\theta 5$ of the first opening AP1 at corners C14 and C18 is 180° or more and $\theta 4$ or less ($180° < \theta 5 < \theta 4$). The first opening AP1 is a two-fold symmetry which becomes the same shape after a 180° rotation. The first opening AP1 is not limited thereto, and may have a rotation symmetry of three times or more.

The extension portion 13 of the scan line 1 overlaps with the line portion 41 to which the electrical element 3 is disposed. The extension portion 13 is formed in the same layer where the first part 11 is formed, and is electrically connected to the second part 12 below the electrical element 3 through a contact hole CH. The contact hole CH passes through the organic insulating layer 5, and overlaps with the inorganic insulating layer 9 and the island part 43 as with the contact holes CH1 and CH2 of the first embodiment.

In the present embodiment, the insulating base 4 includes three differently-shaped openings AP1 to AP3. With these openings, the flexibility and the expansion/contraction characteristics with respect to more directions that those of the first embodiment can be achieved in the flexible substrate 200.

The first opening AP1 and the two second openings AP2 are included in the first area A1, and the third opening AP3 is included in the second area A2. Then, the first area A1 and the second area A2 are repeated alternatively in both the first and second directions D1 and D2. Thus, the openings AP1 to AP3 are arranged in a dispersing manner, and the flexibility and the expansion/contraction characteristics can suitably be applied to the wide range of the flexible substrate 200.

Furthermore, the shapes of the openings AP1 to AP3 are reversed by every row and column, and the line portions 41 and 42 extend in six different directions, and thus, the direction dependency of the flexibility and the expansion/contraction characteristics of the flexible substrate 100 can be suitably reduced.

Third Embodiment

The third embodiment will be described now. Structures and advantages which are not mentioned in this embodiment are the same as in the first embodiment.

Figure 12:
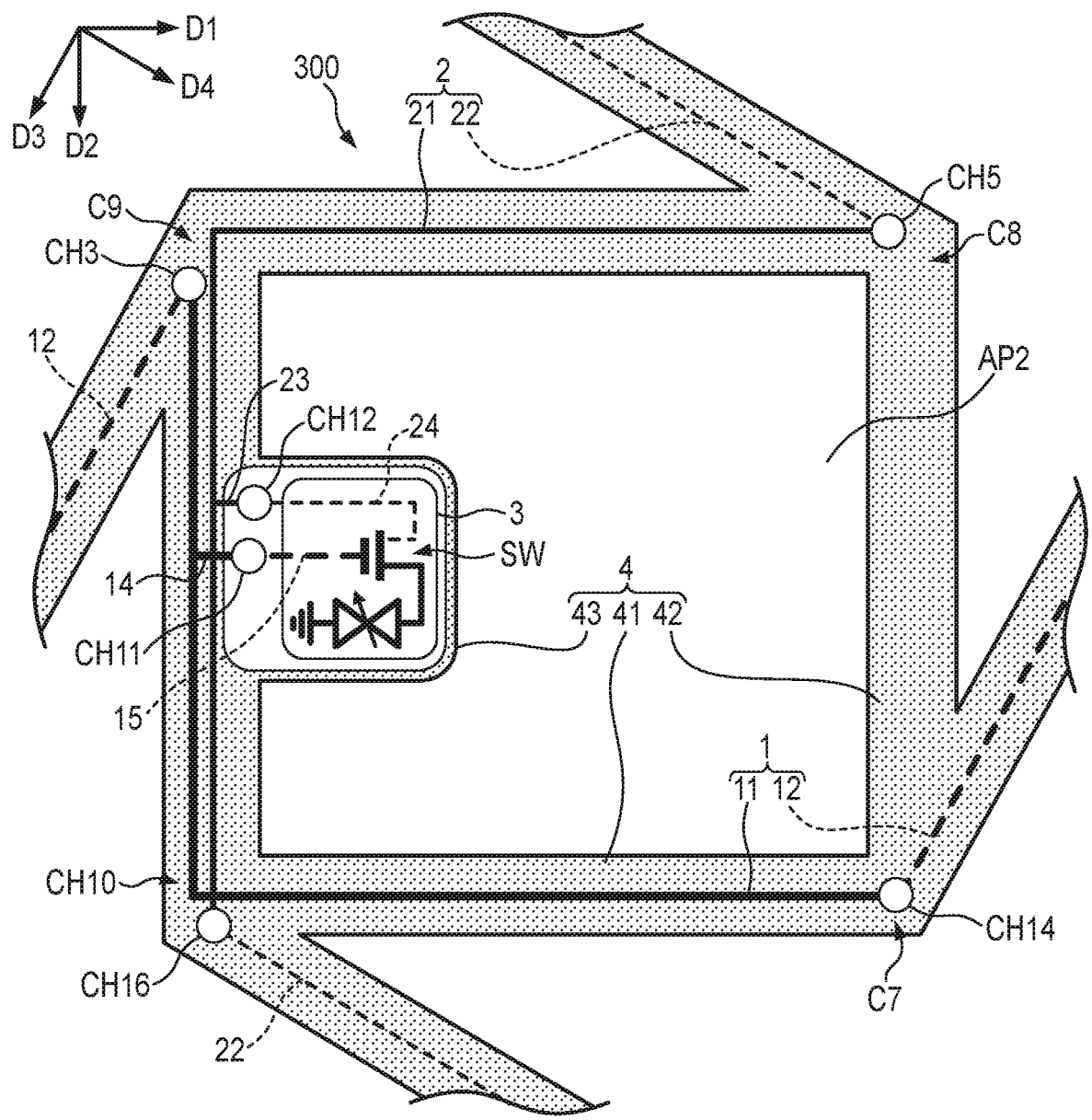
FIG. 12 is a schematic plan view of a flexible substrate 300 of a third embodiment.

FIG. 12 is a schematic plan view of a flexible substrate 300 of the present embodiment. The shapes of the scan line 1, signal line 2, and insulating base 4 in a plan view are the same as in FIG. 2. FIG. 12 illustrates the proximity of the second opening AP2 with corners C7 to C10 in an enlarged manner.

In the present embodiment, the first part 11 of the scan line 1 is disposed between the corners C9 and C10 and between the corners C10 and C7. The other part of the scan line 1 overlapping the line portion 41 is the second part 12 disposed in the layer different from the layer where the first part 11 is disposed. The electrical element 3 is, in the proximity of the line portion 41 between the corners C9 and C10, disposed inside the second opening AP2. The island part 43 is protruded into the inner side of the second opening AP2 from the line portion 41.

The signal line 2 includes a first part 21 depicted in a solid line and a second part 22 depicted in a broken line. The first part 21 and the second part 22 are arranged in different layers. In the example of FIG. 12, the first part 21 is disposed between the corners C8 and C9 and between the corners C9 and C10. The other part of the signal line 2 overlapping the line portion 41 is the second part 22.

The scan line 1 includes, in the proximity of the electrical element 3, a first extension portion 14 and a second extension portion 15. The extension portions 14 and 15 are electrically connected to each other via a contact hole CH11. The first extension portion 14 and the first part 11 are disposed in the same layer, and the second extension portion 15 and the second part 12 are disposed in the same layer.

The signal line 2 includes, in the proximity of the electrical element 3, a first extension portion 23 and a second extension portion 24. The extension portions 23 and 24 are electrically connected to each other via a contact hole CH12. The first extension portion 23 and the first part 21 are disposed in the same layer, and the second extension portion 24 and the second part 22 are disposed in the same layer.

The second extension portion 15 of the scan line 1 is connected to a gate of a switching element SW of the electrical element 3. The second extension portion 24 of the signal line 2 is connected to a source or a drain of the switching element SW.

At the corner C9, the first part 11 and the second part 12 of the scan line 1 are electrically connected via a contact hole CH13. At the corner C7, the first part 11 and the second part 12 of the scan line 1 are electrically connected via a contact hole CH14. At the corner C8, the first part 11 and the second part 12 of the signal line 2 are electrically connected via a contact hole CH15. At the corner C10, the first part 11 and the second part 12 of the signal line 2 are electrically connected via a contact hole CH16.

Figure 13:
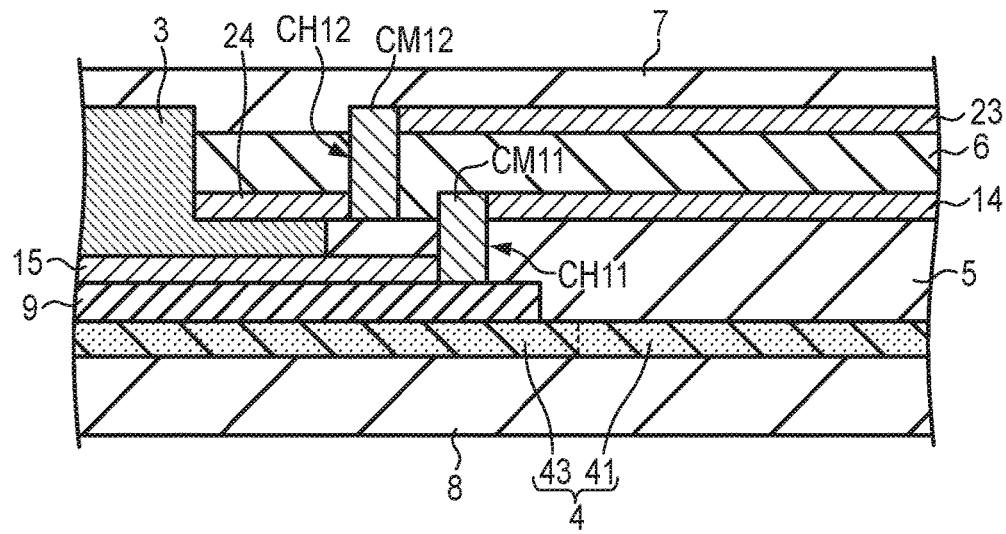
FIG. 13 is a schematic cross-sectional view of a connection model between a scan line, signal line, and electrical element of the flexible substrate 300.

FIG. 13 is a schematic cross-sectional view of a connection model between the scan line 1, signal line 2, and electrical element 3. In this example, for simplification of explanation, the extension portions 14 and 15 of the scan line 1 and the contact hole CH11, and the extension portions 23 and 24 of the signal line 2 and the contact hole CH12 are shown in the same cross-section.

The contact hole CH11 is provided with the first organic insulating layer 5. The contact hole CH12 is provided with the second organic insulating layer 6. The contact holes CH11 and CH12 overlap the island part 43 and the inorganic insulating layer 9 in a plan view. The first and second extension portions 14 and 15 of the scan line 1 are electrically connected via a connection member CM11 disposed in the contact hole CH11. The first and second extension portions 23 and 24 of the signal line 2 are electrically connected via a connection member CM12 disposed in the contact hole CH12. The connection member CM11 may be a part of the first extension portion 14, or may be separated from the first extension portion 14. Similarly, the connection member CM12 may be a part of the first extension portion 23, or may be separated from the first extension portion 23.

Figure 14:
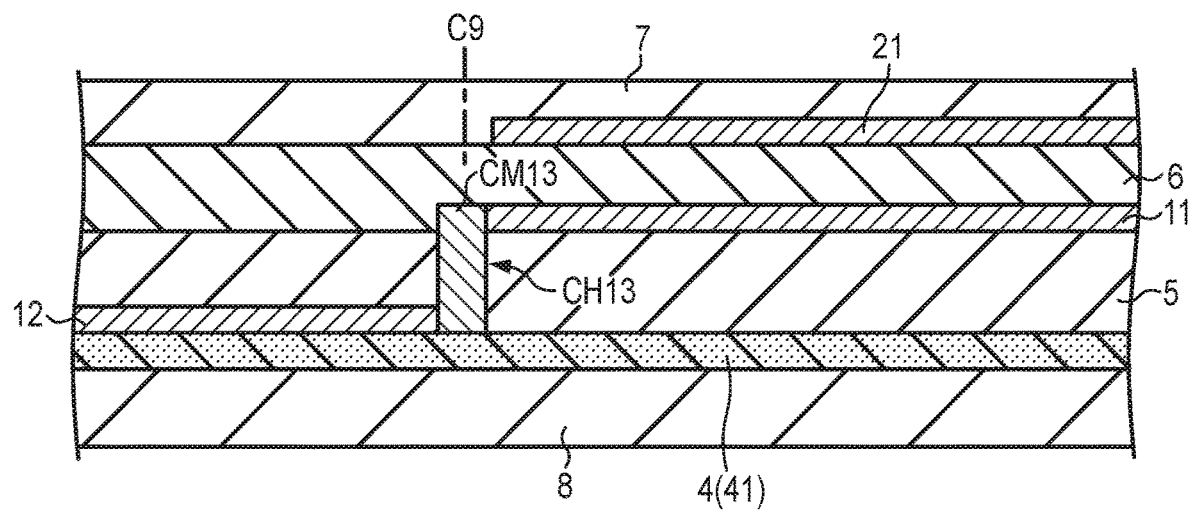
FIG. 14 is a schematic cross-sectional view of the flexible substrate 300 in the proximity of a corner C9 of FIG. 12.

FIG. 14 is a schematic cross-sectional view of the flexible substrate 300 along the scan line 1 in the proximity of the corner C9. The first part 11 of the scan line 1 is disposed above the first organic insulating layer 5. The second part 12 of the scan line 1 is disposed above the insulating base 4 (line portion 41). The contact hole CH13 is provided with the first organic insulating layer 5. the first part 11 and the second part 12 are electrically connected via a connection member CM13 disposed in the contact hole CH13.

Figure 15:
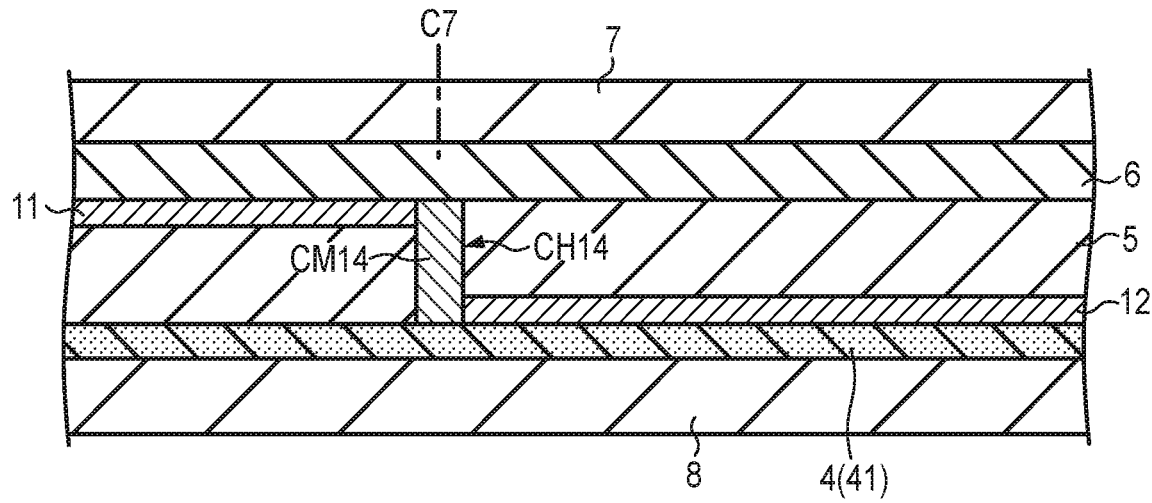
FIG. 15 is a schematic cross-sectional view of the flexible substrate 300 in the proximity of a corner C7 of FIG. 12.

FIG. 15 is a schematic cross-sectional view of the flexible substrate 300 along the scan line 1 in the proximity of the corner C7. The contact hole CH14 is provided with the first organic insulating layer 5. The first part 11 and the second part 12 of the scan line 1 are electrically connected via a connection member CM14 disposed in the contact hole CH14.

Figure 16:
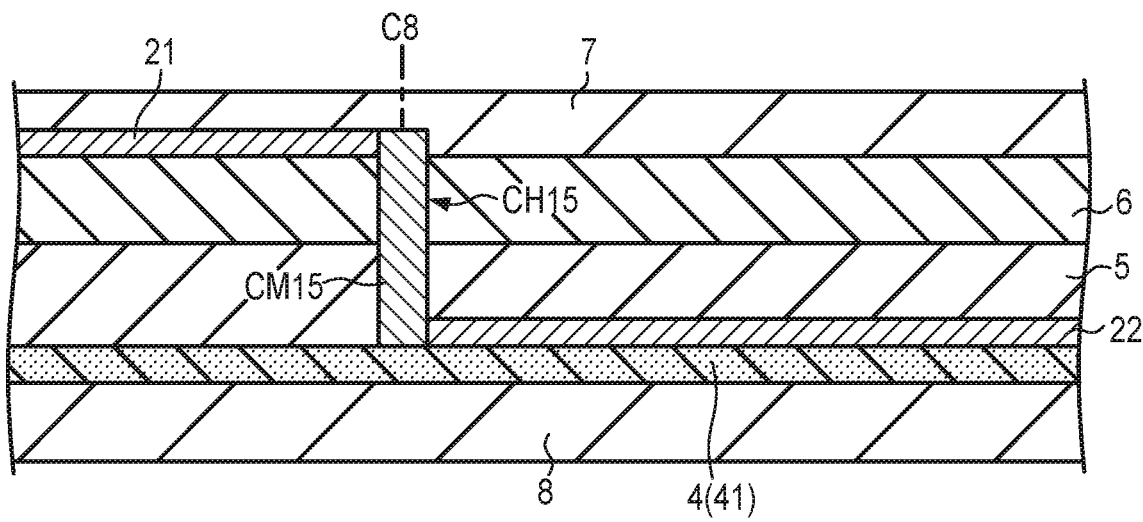
FIG. 16 is a schematic cross-sectional view of the flexible substrate 300 in the proximity of a corner C8 of FIG. 12.

FIG. 16 is a schematic cross-sectional view of the flexible substrate 300 along the signal line 2 in the proximity of the corner C8. The first part 21 of the signal line 2 is disposed above the second organic insulating layer 6. The second part 22 of the signal line 2 is disposed above the insulating base 4 (line portion 41). The contact hole CH15 is provided with the first organic insulating layer 5 and the second organic insulating layer 6. The first part 21 and the second part 22 are electrically connected via a connection member CM15 disposed in the contact hole CH15.

Figure 17:
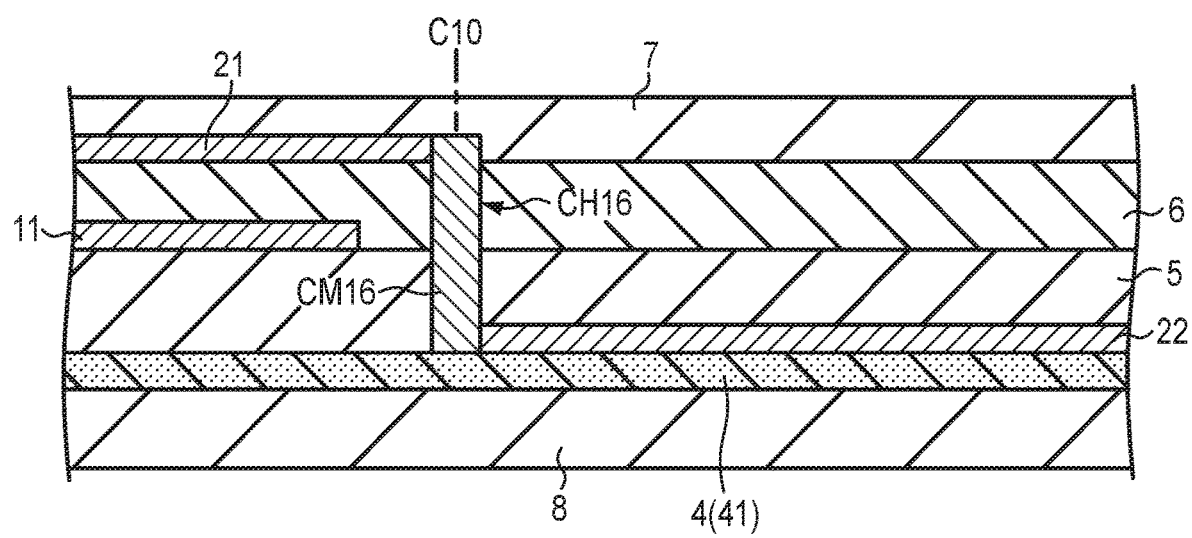
FIG. 17 is a schematic cross-sectional view of the flexible substrate 300 in the proximity of a corner C10 of FIG. 12.

FIG. 17 is a schematic cross-sectional view of the flexible substrate 300 along the signal line 2 in the proximity of the corner C10. The contact hole CH16 is provided with the first organic insulating layer 5 and the second organic insulating layer 6. The first part 21 and the second part 22 of the signal line 2 are electrically connected via a connection member CM16 disposed in the contact hole CH16.

Note that the connection members CM11, CM13, and CM14 may be a part of the first part 11, or may be separated from the first part 11. Furthermore, the connection members CM12, CM15, and CM16 may be a part of the first part 21 of the signal line 2, or may be separated from the first part 21.

If the flexible substrate 300 is extended or bent, a great force is applied to a position where two line portions of the insulating base 4, that is, a bending position of the scan line 1 and the signal line 2. With the structure of the present embodiment in which the scan line 1 is divided into the first part 11 and the second part 12 to be connected through a contact hole in the bending position, the force applied to the scan line 1 in the bending position can be reduced. Similarly, with the structure in which the signal line 2 is divided into the first part 21 and the second part 22 to be connected through a contact hole in the bending position, the force applied to the signal line 2 in the bending position can be reduced. Thus, disconnection of the scan line 1 and the signal line 2 can be prevented.

Note that the shape of an opening of the insulating base 4, and the shape of an area defined by the scan line 1 and the signal line 2 are not limited to the examples of the first to third embodiments. For example, the insulating base 4 may not include a line portion 42 which does not overlap the scan line 1 or the signal line 2. Furthermore, the insulating base 4 may partly include a curved line portion in addition to the linear line portion.

All flexible substrates possibly achievable by a person having ordinary skill in the art by arbitrarily changing the design of the flexible substrate of each of the embodiments of the present application are encompassed by the scope of the invention as long as they are made based on the technical concept of the present application.

Within the range of the technical concept of the present application, many variations may be conceivable, and such variations are naturally encompassed by the scope of the invention of the present application. For example, even if a person having ordinary skill in the art adds or deletes the structural elements to/from each of the embodiments described above, or changes the design of each of the embodiments described above, or adds, omits, or change conditions of each step of the embodiments described above, such cases are encompassed by the scope of the invention of the present application as long as they are made based on the technical concept of the present application.

Furthermore, other possible advantages are, if they are clear from the description of the present application or are easily conceivable by a person having ordinary skill in the art, considered achievable by the invention of the present application.

What is claimed is:

1. A flexible substrate comprising:
a flexible insulating base; and
a plurality of wirings on the flexible insulating base, wherein
the flexible insulating base includes a first opening, a second opening having a shape different from that of the first opening, and a first line portion, and
the first line portion is disposed between the first opening and the second opening.

2. The flexible substrate of claim 1, wherein
the first line portion does not overlap the plurality of wirings in a plan view.

3. The flexible substrate of claim 1, wherein the plurality of wirings include:
a plurality of scan lines extending in a first direction and aligned in a second direction which is orthogonal to the first direction; and
a plurality of signal lines extending in the second direction and aligned in the first direction, wherein
the first opening and the second opening are included in an area defined by two adjacent scan lines of the plurality of scan lines and two adjacent signal lines of the plurality of signal lines.

4. The flexible substrate of claim 3, further comprising an electrical element to which a scan signal is supplied from one of the plurality of scan lines, wherein
the electrical element is supported by an island part of the flexible insulating base positioned between the first opening and the second opening, and
an inorganic insulating layer is disposed between the electrical element and the flexible insulating base.

5. The flexible substrate of claim 1, wherein
the first opening is defined by the first line portion and a first group of line portions of the flexible insulating base connecting with the first line portion,
the second opening is defined by the first line portion and a second group of line portions of the flexible insulating base connecting with the first line portion, and
the number of the line portions of the first group is different from the number of the line portions of the second group.

6. The flexible substrate of claim 1, wherein the shape of the first opening has a rotation symmetry of four times or more.

7. The flexible substrate of claim 1, wherein the first opening is defined by a plurality of line portions extending in four or more different directions.

8. The flexible substrate of claim 1, wherein the first opening includes an interior angle of 180° or more.

9. The flexible substrate of claim 1, further comprising an organic insulating layer overlapping the flexible insulating base, wherein
at least one of the wirings of the plurality of wirings include a first part disposed above the organic insulating layer and a second part disposed below the organic insulating layer, and
the first part and the second part are electrically connected through a contact hole provided with the organic insulating layer.

10. The flexible substrate of claim 1, further comprising a support film supporting the flexible insulating base, wherein
the support film overlaps the first opening and the second opening in a plan view.

11. The flexible substrate of claim 1, wherein
the flexible insulating base further includes a third opening shape of which is different from that of the first opening and the second opening.

12. The flexible substrate of claim 11, wherein
the flexible insulating base further includes a second line portion disposed between the first opening and the third opening, and
the second line portion overlaps with at least one of the wirings of the plurality of wirings in a plan view.

13. A flexible substrate, comprising:
a flexible insulating base; and
a plurality of wirings on the flexible insulating base, wherein
the flexible insulating base includes a plurality of first openings and a plurality of second openings having a shape which is different from the first openings,
the first openings and the second openings are disposed alternatively, and
the flexible insulating base of linear shape is disposed between the first openings and the second openings.

14. The flexible substrate of claim 13, wherein the plurality of wirings include:
a plurality of scan lines extending in a first direction and aligned in a second direction which is orthogonal to the first direction; and
a plurality of signal lines extending in the second direction and aligned in the first direction, wherein
one of the first openings and one of the second openings are included in an area defined by two adjacent scan lines of the plurality of scan lines and two adjacent signal lines of the plurality of the signal lines.

15. The flexible substrate of claim 14, further comprising an electrical element to which a scan signal is supplied from one of the plurality of scan lines, wherein
the electrical element is supported by an island part of the flexible insulating base positioned between the first opening and the second opening, and
an inorganic insulating layer is disposed between the electrical element and the flexible insulating base.

16. The flexible substrate of claim 13, wherein the shape of the first opening has a rotation symmetry of four times or more.

17. The flexible substrate of claim 13, wherein the first opening is defined by a plurality of line portions extending in four or more different directions.

18. The flexible substrate of claim 13, wherein the first opening includes an interior angle of 180° or more.

19. The flexible substrate of claim 13, further comprising an organic insulating layer overlapping the flexible insulating base in a plan view, wherein
at least one of the wirings of the plurality of wirings include a first part disposed above the organic insulating layer and a second part disposed below the organic insulating layer, and
the first part and the second part are electrically connected through a contact hole provided with the organic insulating layer.

20. The flexible substrate of claim 13, further comprising a support film supporting the flexible insulating base, wherein
the support film overlaps with the first opening and the second opening in a plan view.

* * * * *